(12) United States Patent
Parrini et al.

(10) Patent No.: US 11,041,937 B2
(45) Date of Patent: Jun. 22, 2021

(54) MULTIPLE RADARS ON CHIP-BASED SYSTEMS

(71) Applicant: Inxpect S.p.A., Brescia (IT)

(72) Inventors: Filippo Parrini, Florence (IT); Luca Salgarelli, Besana in Brianza (IT); Michael Granski, Tel Aviv (IL)

(73) Assignee: INXPECT S.P.A., Brescia (IT)

( * ) Notice: Subject to any disclaimer, the term of this patent is extended or adjusted under 35 U.S.C. 154(b) by 229 days.

(21) Appl. No.: 16/101,868

(22) Filed: Aug. 13, 2018

(65) Prior Publication Data
US 2019/0049554 A1 Feb. 14, 2019

Related U.S. Application Data

(60) Provisional application No. 62/545,106, filed on Aug. 14, 2017.

(51) Int. Cl.
| | |
|---|---|
| *G01S 7/03* | (2006.01) |
| *H03F 3/195* | (2006.01) |
| *H03L 7/099* | (2006.01) |
| *H03F 3/24* | (2006.01) |
| *G01S 13/87* | (2006.01) |

(52) U.S. Cl.
CPC .............. *G01S 7/032* (2013.01); *G01S 13/87* (2013.01); *H03F 3/195* (2013.01); *H03F 3/245* (2013.01); *H03L 7/099* (2013.01); *H03F 2200/451* (2013.01)

(58) Field of Classification Search
CPC ........ G01S 7/032; G01S 13/931; G01S 13/87; H03F 3/195; H03F 3/245; H03L 7/099; H03L 7/197; H03L 7/1974; H03L 7/235; H03L 2007/06

USPC ................................................... 342/195, 103
See application file for complete search history.

(56) References Cited

U.S. PATENT DOCUMENTS

| | | | |
|---|---|---|---|
| 2005/0064892 A1* | 3/2005 | Cavin ...................... H03L 7/22 455/550.1 |
| 2016/0187464 A1* | 6/2016 | Ginsburg .............. G01S 7/4008 342/168 |
| 2016/0245898 A1* | 8/2016 | Li ......................... G01S 13/931 |
| 2018/0019755 A1* | 1/2018 | Josefsberg ................ H03L 7/07 |

\* cited by examiner

*Primary Examiner* — Erin F Heard
*Assistant Examiner* — Michael W Justice
(74) *Attorney, Agent, or Firm* — MH2 Technology Law Group, LLP

(57) ABSTRACT

A multiple scalable radar on chip (SROC) based system in a multi-array configuration; may include: a first SROC; and a second SROC. The first SROC may include a ramp generator, a fractional-N PLL synthesizer, a frequency multiplier, a power amplifier, 'Y' number of transmitter chains, 'Z' number of receiver chains, and a receiver section. The second SROC may include a ramp generator, a fractional-N PLL synthesizer, a frequency multiplier, a power amplifier, 'Y' number of transmitter chains, 'Z' number of receiver chains, and a receiver section. The ramp generator of the first SROC may be configured to drive the fractional-N PLL synthesizer of the second SROC. The fractional-N PLL synthesizer of the second SROC may be configured to produce radio frequency (RF) ramp signals to drive both the first and second SROCs. 'Y' and 'Z' may represent positive integers.

20 Claims, 4 Drawing Sheets

MULTIPLE RADARS ON CHIP-BASED SYSTEMS

CROSS-REFERENCE TO RELATED APPLICATION(S)

This application claims the benefit under 35 U.S.C. § 119(e) of U.S. provisional patent application No. 62/545,106, filed on Aug. 14, 2017, in the United States Patent and Trademark Office ("USPTO"), the entire contents of which are incorporated herein by reference.

TECHNICAL FIELD

The present invention generally relates to radar based systems by integrating transmitter and receiver channels of the radar system on a single semiconductor radar chip.

BACKGROUND

Radar is a detection system that uses radio waves to determine the range, angle, or velocity of objects. It consists of a transmitter producing electromagnetic waves in the radio or microwaves domain, a transmitting antenna and a receiver and processor to determine properties of the objects. Radio waves from the transmitter reflect off the object and return to the receiver, giving information about the objects location and speed.

Radar systems are often characterized by the number of transmitters and receivers channels they possess. In the past several years, technology has evolved to the point that it is now possible to integrate a complete radar system into a single semiconductor chip, which includes power amplifiers, receiver chains, frequency multipliers, PLL (Phase locked loop) synthesizer and ramp generators. The radar system measures the bearing and distance of the obstacles that approach in their path while also displaying the weather condition information and give accurate altitude readings for navigation. Radar is also use for monitor precipitation and wind by meteorologists and has become a primary tool for short-term weather forecasting analysing thunderstorms, tornadoes, winter storms, precipitation types etc. Geologists also use specialized ground-penetrating radars to map the composition of earth's surface. Police forces use radar guns to monitor vehicle speeds on the roads. Smaller radar systems are used to detect human movement, Automatic door opening, light activation and intruder sensing.

While integrating multiple transmitter and receiver channels on the same ROC (Radar on chip) increases the performance of the radar, it also increases the size of the die, its cost and its complexity. Moreover, it limits its flexibility. While having many transmitter or receiver channels is necessary for a ROC integrated in a system for high end applications, a ROC with less transmitter or receiver chains might be enough for less critical applications.

Hence there is a strong need and demand for the creation of systems using combination of multiple scalable ROC's that are powerful and contain as many transmitter or receiver chains as needed, while at the same time supporting systems for less demanding applications.

SUMMARY

The present invention overcomes the above problem of increase in the size of the die, its cost and limited flexibility by providing a system which is powerful and contains as many transmitter or receiver chains as needed and supporting systems for less demanding applications utilizing combination of multiple scalable radar on chips.

In accordance with the first aspect of the present invention, an embodiment herein describes the architecture of the scalable radar on chip. The SROC (Scalable radar on chip) architecture mainly comprises four parts—a fractional-N PLL synthesizer, a digital ramp generator, a Tx (Transmitter) section composed of a frequency multiplier and Y number of transmitter chains and an Rx (Receiver) section composed of Z number of receiver chains based on a homodyne architecture.

In accordance with the second aspect of the present invention, the fractional-N PLL synthesizer can be based on a standard controller where the N-division factor is controlled by a delta-sigma modulator to obtain a division factor that cannot be an integer. The fractional-N PLL synthesizer comprises several components such as R-divider, phase comparator, charge pump, low-pass filter, VCO (Voltage controlled oscillator), prescaler, fractional-N divider and delta sigma modulator.

In accordance with the third aspect of the present invention, the SROC's synthesizer provides several outputs that can be used as an input by multiple transmitter sections which is one of the main characteristics of the SROC design that allows its use in an array-configuration of identical elements. The preferred embodiment herein describes a system obtained using two SROCs to create a radar system with double the number of transmitter and receiver channels of a single ROC. Reducing the number of transmitters and receivers of the SROC drives down both its engineering and manufacturing costs. This is of paramount importance for love-end applications, where a low number of transmitter or receiver channels might be required. The larger number of transmitter or receiver channels is bound only by the number of SROCs that can be placed in an array, which in turn is determined by the number (W) of outputs of the PLL synthesizer block.

In accordance with the fourth aspect of the present invention, the SROC architecture mainly comprises a Tx (Transmitter) section composed of a Y number of transmitter chains and an Rx (Receiver) section composed of Z number of receiver chains based on a homodyne architecture, while ramp generator and PLL synthesizer are off chip and frequency multiplier can be on chip or absent.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein.

The embodiments herein achieve this by providing a system which is powerful and contain as many transmitter or receiver chains as needed, and supporting systems for less demanding applications utilizing combination of multiple scalable radar on chips.

Figure 1:
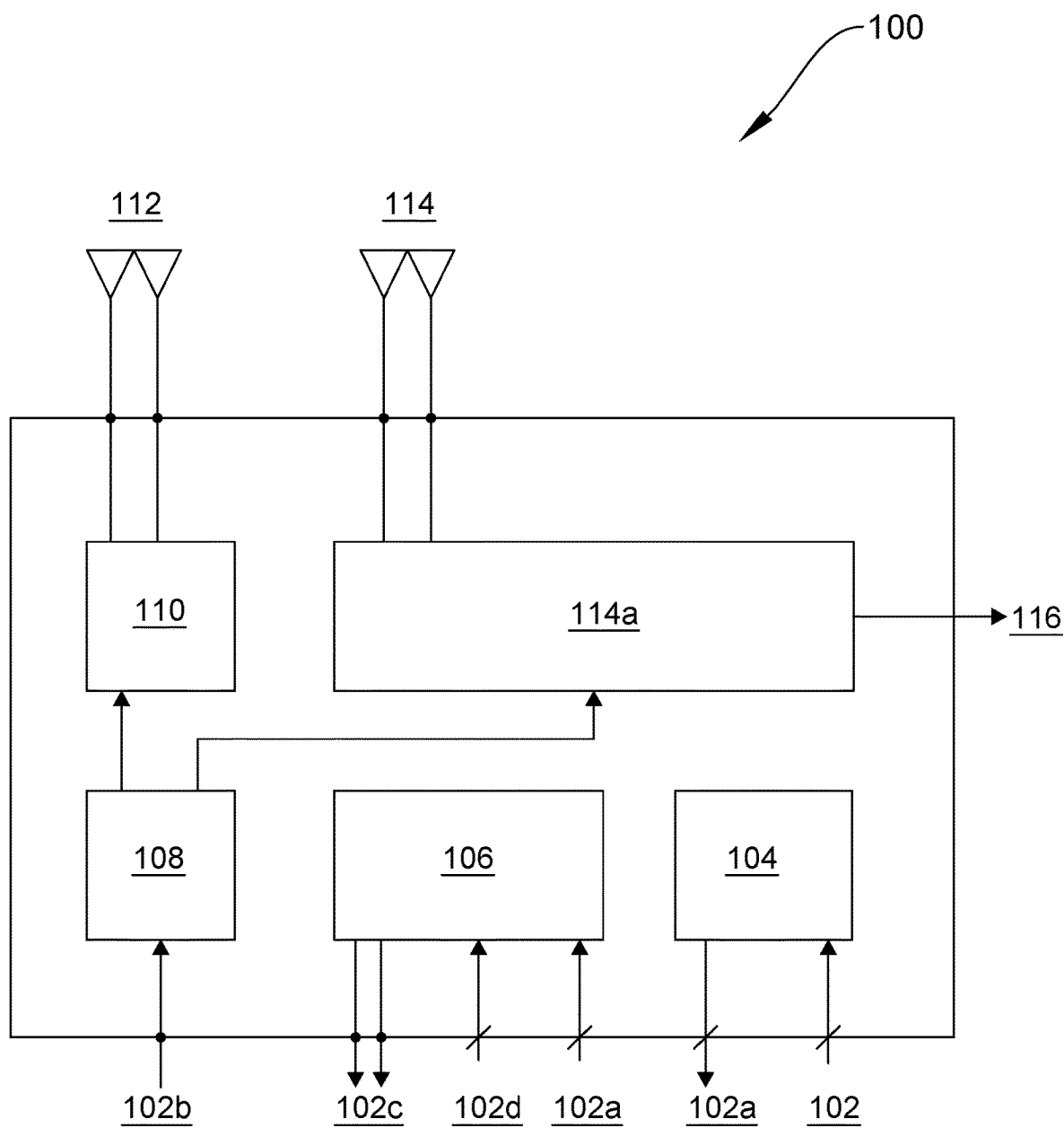
FIG. 1 illustrates the internal architecture of scalable radar on chip system.

FIG. 1 is a block diagram illustrating a SROC system 100 internal architecture according to one embodiment of the present invention. The SROC system 100 comprises a ramp generator 104 configured to input a digital signal 102 and process it. The digital signal 102 gets converted to digital ramp signal 102a after processing, which then passes through a fractional-N PLL synthesizer 106 having a reference input 102d. The fractional-N PLL synthesizer 106 provides several outputs in the form of W number of analog RF (Radio frequency) ramp signals 102c. A analog RF ramp signal 102c is then passed to a frequency multiplier 108 of transmitter section comprising of Y number of transmitter chains 112. The frequency multiplier 108 generates an output signal whose output frequency is a multiple of its input frequency. A LO (Local oscillator) signal is generated for the up and down conversion of the RF ramp signal 102b. The RF ramp signal 102b from frequency multiplier 108 is passed to a power amplifier 110 where the RF ramp signal 102b is amplified and provided sufficient output power. This amplified RF ramp output signal is being passed to the transmitter section comprising of Y number of transmitter chains 112 from where it is being passed to the Z number of receiver chains 114a of the receiver section 114 and output 116 is being processed.

Figure 2:
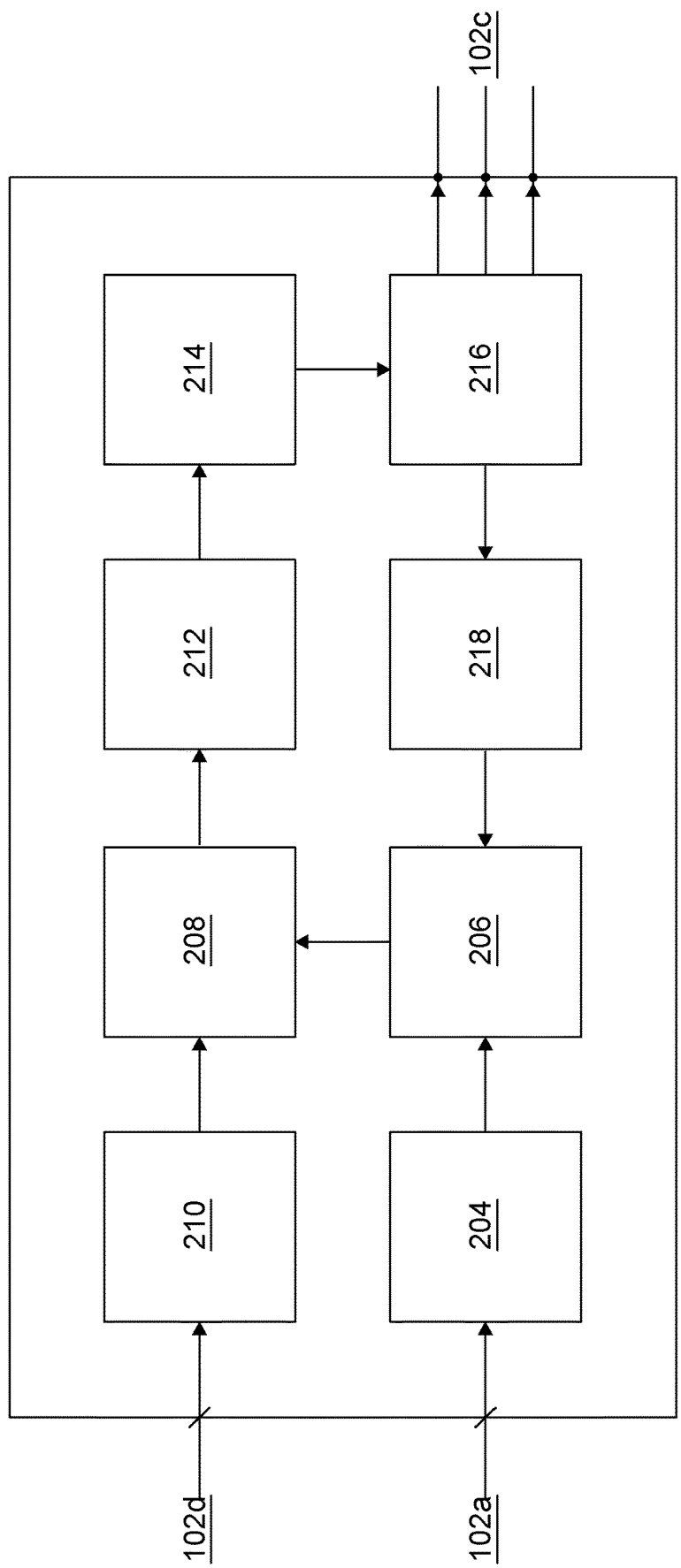
FIG. 2 illustrates the block diagram of a fractional-N PLL synthesizer.

FIG. 2 is a block diagram illustrating architecture of fractional-N PLL synthesizer 106 according to second embodiment of the present invention. The fractional-N PLL synthesizer 106 is based on a standard PLL controller where the N division factor is controlled by a delta sigma modulator 204 to obtain a division factor that cannot be an integer. A reference input 102d in the form of a digital signal is provided to the R-divider 210 which further passes the reference input 102d to phase comparator 208. Another digital ramp signal 102a is input to the delta sigma modulator 204 which produces a bitstream wherein the average level of this bitstream represents the input signal level. The signal then passes to fractional-N divider 206 from where it reaches the phase comparator 208. The phase comparator 208 generates a voltage signal which represents the difference in phase between two signal inputs. The loop will lock when the two signals entering the phase comparator 208 are of the same frequency. The low-pass filter 214 receives the signal through the charge pump 212 which lowers or raises the voltage by storing charge in the form of energy. The low-pass filter 214 passes signals with a frequency lower than a certain cut-off frequency and attenuates signals with frequencies higher than the cut-off frequency. The VCO (Voltage controlled oscillator) 216 after receiving the signal from low-pass filter 214 performs frequency modulation and processes the signal to give a plurality of RF ramp signals as an output. The prescaler 218 is used to generate an output signal of a frequency taking an input signal of a frequency.

Figure 3:
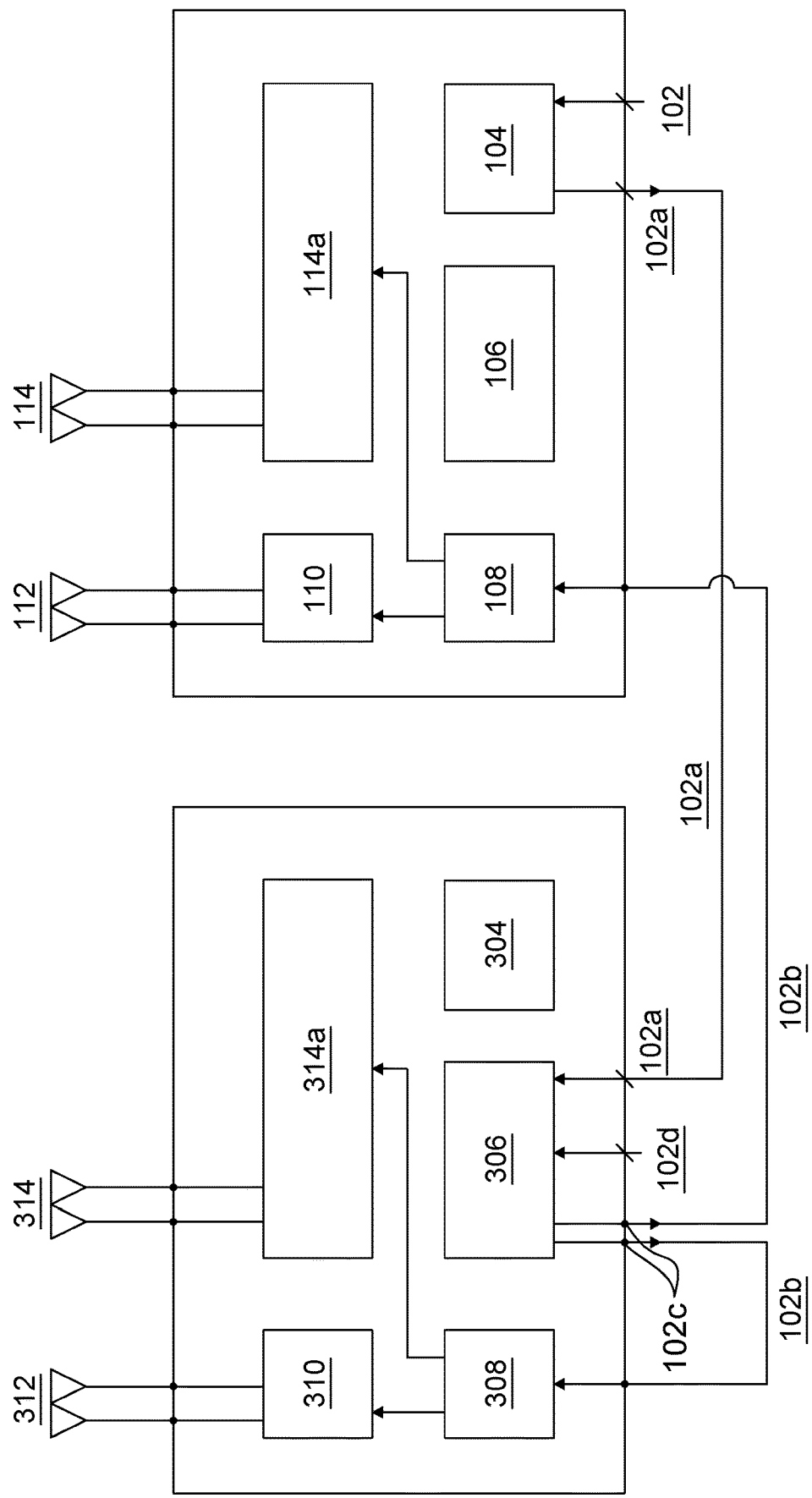
FIG. 3 illustrates the internal architecture of multiple scalable radar on chip system in a two-array configuration.

FIG. 3 is a block diagram illustrating the internal architecture of multiple scalable radar on chip system in a multi-array configuration according to third embodiment of the present invention. The multi-array configuration of two SROCs mainly comprises first SROC and second SROC. The first SROC further comprises a ramp generator 304, fractional-N PLL synthesizer 306, frequency multiplier 308, power amplifier 310, Y number of transmitter chains 312, Z number of receiver chains 314a and receiver section 314. The second SROC further comprises a ramp generator 104, fractional-N PLL synthesizer 106, frequency multiplier 108, power amplifier 110, Y number of transmitter chains 112, Z number of receiver chains 114a and receiver section 114. The ramp generator 104 of the second SROC is used to drive the fractional-N PLL synthesizer 306 of the first SROC, which in turn produces the RF ramps required to drive both first and second SROCs. In this example, the ramp generator 304 of the first SROC and the fractional-N PLL synthesizer 106 of the second SROC are not used. The system obtained in this example uses two SROCs to create a radar system with double the number of Tx and Rx channels of a single SROC. The above architecture can be extended to obtain the required number of Rx and Tx channels, by combining the adequate number of SROCs up to IV, which is the number of outputs of the PLL synthesizer block 306.

Figure 4:
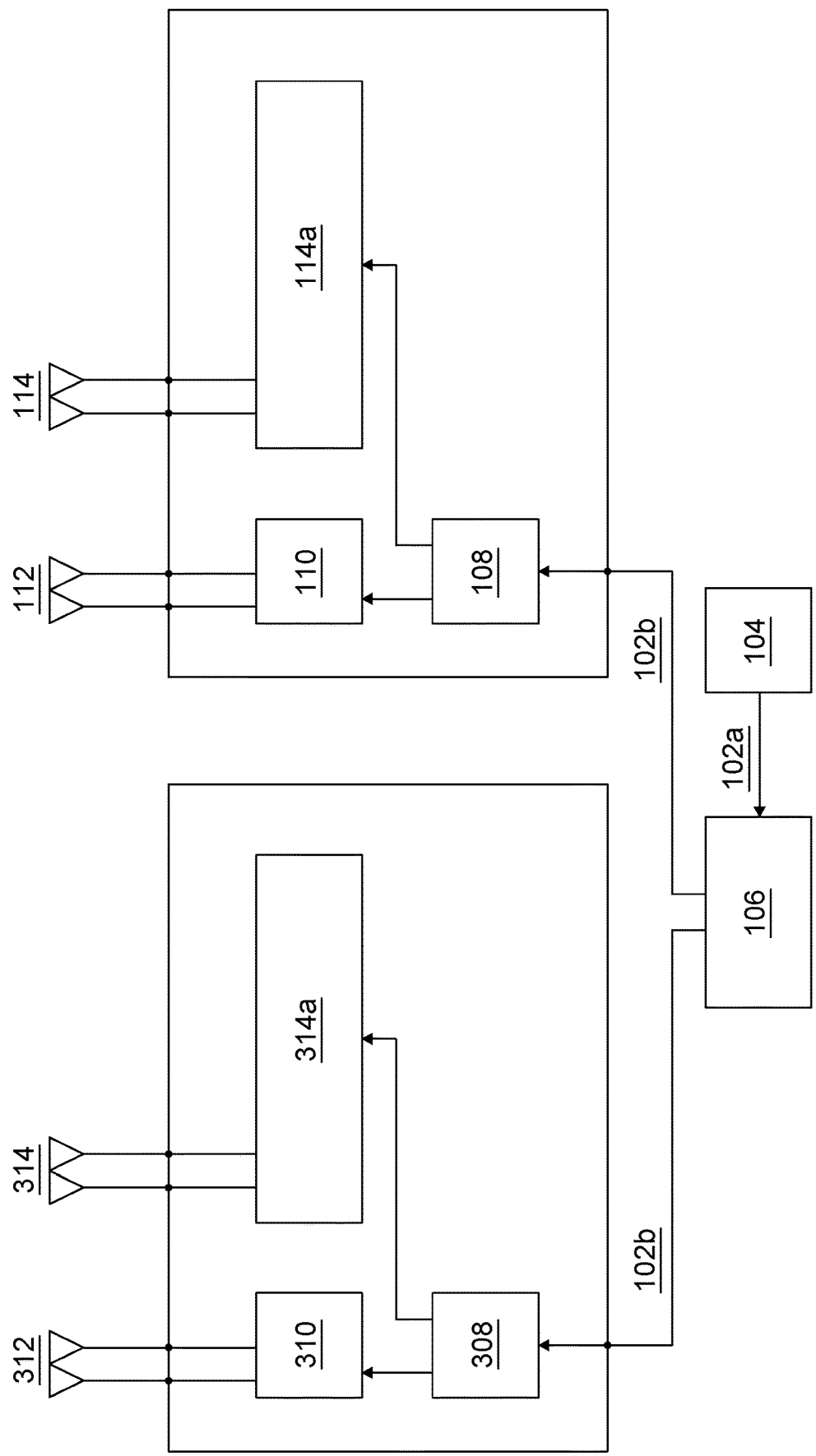
FIG. 4 illustrates a further embodiment of the internal architecture of multiple scalable radar on chip.

FIG. 4 is a block diagram illustrating the internal architecture of multiple scalable radar on chip system in a multi-array configuration according to a fourth embodiment of the present invention. The multi-array configuration of two SROCs mainly comprises first SROC and second SROC, an off-chip ramp generator 104 and an-off chip fractional-N PLL synthesizer 106. The first SROC comprises frequency multiplier 308, power amplifier 310, Y number of transmitter chains 312, Z number of receiver chains 314a and receiver section 314. The second SROC further comprises frequency multiplier 108, power amplifier 110, Y number of transmitter chains 112, Z number of receiver chains 114a and receiver section 114. The frequency multipliers 108, 308 may be absent n certain application in which there is no need for multiplication of frequency. The ramp generator 104 is used to drive the fractional-N PLL synthesizer 106 which in turn produces the RF ramps required to drive both first and second SROCs. The system obtained in this example uses two SROCs to create a radar system with double the number of Tx and Rx channels of a single SROC. The above architecture can be extended to obtain the required number of Rx and Tx channels, by combining the adequate number of SROC's up to W, which is the number of outputs of the PLL synthesizer 106.

As mentioned, there remains the foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

The invention claimed is:

1. A multiple scalable radar on chip (SROC) based system in a multi-array configuration, the system comprising:
    a first SROC; and
    a second SROC;
    wherein the first SROC comprises:
        a ramp generator;
        a fractional-N PLL synthesizer;
        a transmitter section comprising a frequency multiplier, 'Y' number of transmitter chains, and a power amplifier; and
        a receiver section comprising 'Z' number of receiver chains;
    wherein the second SROC comprises:
        a ramp generator;
        a fractional-N PLL synthesizer;
        a transmitter section comprising a frequency multiplier, 'Y' number of transmitter chains, and a power amplifier; and
        a receiver section comprising 'Z' number of receiver chains;
    wherein the ramp generator of the second SROC is configured to drive the fractional-N PLL synthesizer of the first SROC,
    wherein the fractional-N PLL synthesizer of the first SROC is configured to produce radio frequency (RF) ramp signals to drive both the first and second SROCs, and
    wherein 'Y' and 'Z' represent positive integers.

2. The system of claim 1, wherein the multi-array configuration of SROCs comprises the first SROC as master SROC and the second SROC as slave SROC.

3. The system of claim 1, wherein 'W' number of SROCs can be configured together in an array comprising one master SROC and at least one slave SROC, and
    wherein 'W' represents a positive integer.

4. The system of claim 3, wherein a required number of transmitter and receiver channels is obtained by combining an adequate number of SROCs up to 'W', and
    wherein 'W' is a number of outputs of the fractional-N PLL synthesizers.

5. The system of claim 1, wherein the multi-array configuration increases a number of transmitter and receiver channels of a single SROC.

6. The system of claim 1, wherein the multi-array configuration of the first and second SROCs is used to create a radar system with double the number of transmitter and receiver channels of a single SROC.

7. The system of claim 1, wherein the ramp generator of the first SROC and the fractional-N PLL synthesizer of the second SROC are left unused.

8. The system of claim 1, wherein the ramp generator of the first SROC drives the fractional-N PLL synthesizer of the second SROC.

9. The system of claim 1, wherein the fractional-N PLL synthesizer of the second SROC produces the RF ramp signals to drive both the first and second SROCs.

10. The system of claim 1, wherein the ramp generator of the second SROC is configured to input and process a digital signal.

11. The system of claim 1, wherein the ramp generator of the second SROC is configured to output a digital ramp signal.

12. A multiple scalable radar on chip (SROC) based system in a multi-array configuration, the system comprising:
    a first SROC; and
    a second SROC;
    wherein the first SROC comprises:
        a ramp generator;
        a fractional-N PLL synthesizer;
        a transmitter section comprising a frequency multiplier, 'Y' number of transmitter chains, and a power amplifier; and
        a receiver section comprising 'Z' number of receiver chains;
    wherein the second SROC comprises:
        a ramp generator;
        a fractional-N PLL synthesizer;
        a transmitter section comprising a frequency multiplier, 'Y' number of transmitter chains, and a power amplifier; and
        a receiver section comprising 'Z' number of receiver chains;
    wherein the ramp generator of the second SROC drives the fractional-N PLL synthesizer of the first SROC,
    wherein the fractional-N PLL synthesizer of the first SROC produces radio frequency (RF) ramp signals to drive both the first and second SROCs, and
    wherein 'Y' and 'Z' represent positive integers.

13. The system of claim 12, wherein the multi-array configuration of SROCs comprises the first SROC as master SROC and the second SROC as slave SROC.

14. The system of claim 12, wherein 'W' number of SROCs are configured together in an array comprising one master SROC and at least one slave SROC, and
    wherein 'W' represents a positive integer.

15. The system of claim 14, wherein a required number of transmitter and receiver channels is obtained by combining an adequate number of SROCs up to 'W', and
    wherein 'W' is a number of outputs of the fractional-N PLL synthesizers.

16. The system of claim 12, wherein the multi-array configuration increases a number of transmitter and receiver channels of a single SROC.

17. The system of claim 12, wherein the multi-array configuration of the first and second SROCs is used to create a radar system with double the number of transmitter and receiver channels of a single SROC.

18. The system of claim 12, wherein the ramp generator of the first SROC and the fractional-N PLL synthesizer of the second SROC are left unused.

19. The system of claim 12, wherein the ramp generator of the second SROC inputs and processes a digital signal.

20. The system of claim 12, wherein the ramp generator of the second SROC outputs a digital ramp signal.

* * * * *